Sept. 4, 1962 J. HOLZER ET AL 3,052,854

PHASE STABLE DIVIDER CIRCUIT

Filed April 5, 1960

*INVENTORS,*
JOHANN HOLZER
YOSHIO NARITA

*BY* Harry M. Saragovitz
*ATTORNEY.*

United States Patent Office 3,052,854

Patented Sept. 4, 1962

3,052,854
PHASE STABLE DIVIDER CIRCUIT

Johann Holzer, Long Branch, and Yoshio Narita, Red Bank, N.J., assignors to the United States of America as represented by the Secretary of the Army Filed Apr. 5, 1960, Ser. No. 20,228
3 Claims. (Cl. 331—51)
(Granted under Title 35, U.S. Code (1952), sec. 266)

The invention described herein may be manufactured and used by or for the Government for governmental purposes, without the payment of any royalty thereon.

This invention relates to divider circuits and more particularly to phase stable divider circuits including a transistorized blocking oscillator.

Phase stable divider arrangements have been utilized in many situations. The present circuit shown in the drawing is an illustrative embodiment adapted particularly for use for timing or memory circuits. Presently available memory circuits, however, use complex electronic circuitry such as shift registers or expensive devices such as delay lines.

It is an object of this invention to provide a simple and inexpensive divider circuit useful for timing and memory purposes.

Another object of the invention is to provide an improved phase stable divider circuit.

In accordance with the invention there is provided a frequency divider circuit which includes a blocking oscillator having an input circuit and an output circuit, and a tank circuit having a preselected natural frequency and stability. Included further are means for triggering the tank circuit into oscillation at a prescribed frequency having preselected phase and amplitude. Also included is a source of clock pulses and means for gating the clock pulses through the tank circuit to the input of the oscillator, whereby a preselected clock pulse triggers the blocking oscillator. Included further are means in circuit with the output of the blocking oscillator and the gating means for feeding energy into the tank circuit when the blocking oscillator is conducting, whereby the tank circuit maintains oscillation in phase with the preselected triggering pulses derived from the source of clock pulses.

For a more detailed description of the invention, together with other and further objects thereof, reference is had to the following description taken in connection with the accompanying drawing, wherein.

Figure 1:
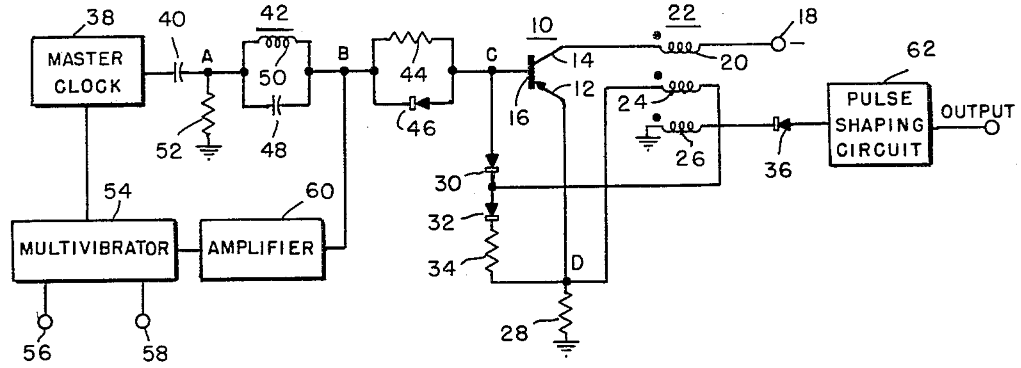
FIG. 1 is a schematic illustration of a basic embodiment of the invention.

The circuit arrangement shown in FIG. 1 provides a divider circuit which includes a blocking oscillator comprising a multiwinding transformer 22 and a PNP junction transistor 10 having an emitter 12, a collector 14 and base 16. In accordance with well known transistor theory, very little, if any, current flows through the transistor when the N-type base is positive relative to the P-type emitter, whereas a relatively large current flows when the N-type base is negative relative to the P-type emitter or collector by as little as a fraction of a volt. In this respect, it should be readily apparent that an NPN function transistor could be used in the place of the PNP transistor shown by such alterations in the circuitry as are known in the transistor art.

A source of direct current voltage, designated by the negative terminal 18, provides the necessary driving potential for transistor 10. Collector 14 is connected to terminal 18 through the primary winding 20 of multiwinding transformer 22 having secondary and tertiary windings 24 and 26. Emitter 12 is connected to ground through resistor 28. Base 16 is also connected to ground through a diode 30 and through two parallel current paths connected to resistor 28; one of which paths includes the secondary winding 24 of transformer 22, and the other of which includes a diode 32, and resistor 34, in series. Diodes 30 and 32 are poled for conduction from base 16 to point D, then junction between winding 24 and resistors 34 and 28. The windings of transformer 22 are in phase, so that collector 14 is inductively coupled to base 16 by mutual inductance of the proper polarity existing between primary coil 20 and secondary coil 24. The transformer 22 windings are so arranged that the polarity of the voltages induced in the secondary 24 and tertiary 26 windings are the same at the terminals marked with dots. The output of the divider is obtained across the terminals of tertiary winding 26 and coupled by means of an isolating diode 36 through a suitable pulse shaping circuit 62 to the output.

A master clock 38, supplying negative pulses at regular intervals, is connected through coupling capacitor 40 to a tank circuit 42 comprising the parallel arrangement of capacitor 48 and inductance 50. A parallel arrangement of resistor 44 and diode 46 is connected between tank circuit 42 and base 16 (point C) of transistor 10, with diode 46 poled for conduction towards point B which is the junction of the tank circuit and the parallel arrangement of resistor 44 and diode 46. Resistor 52 has one terminal connected to ground and another terminal connected to the junction A between tank circuit 42 and coupling capacitor 40.

A bistable multivibrator 54, having two conditions of stability, can be caused to shift abruptly from either condition to the other in response to control signals fed to set terminal 56 or reset terminal 58. The output of multivibrator 54 controls the conduction or non-conduction of gating amplifier 60. When the reset pulse is applied to multivibrator 54 by way of terminal 58, its output assumes a lower voltage level and amplifier 60 conducts, applying current to point B. When the set pulse is applied to multivibrator 54 via terminal 56, the multivibrator is at the higher voltage level and amplifier 60 is cut off. The set pulse 56 is arranged in the correct timing relation to synchronize with one of the pulse from master clock 38.

Figure 2:
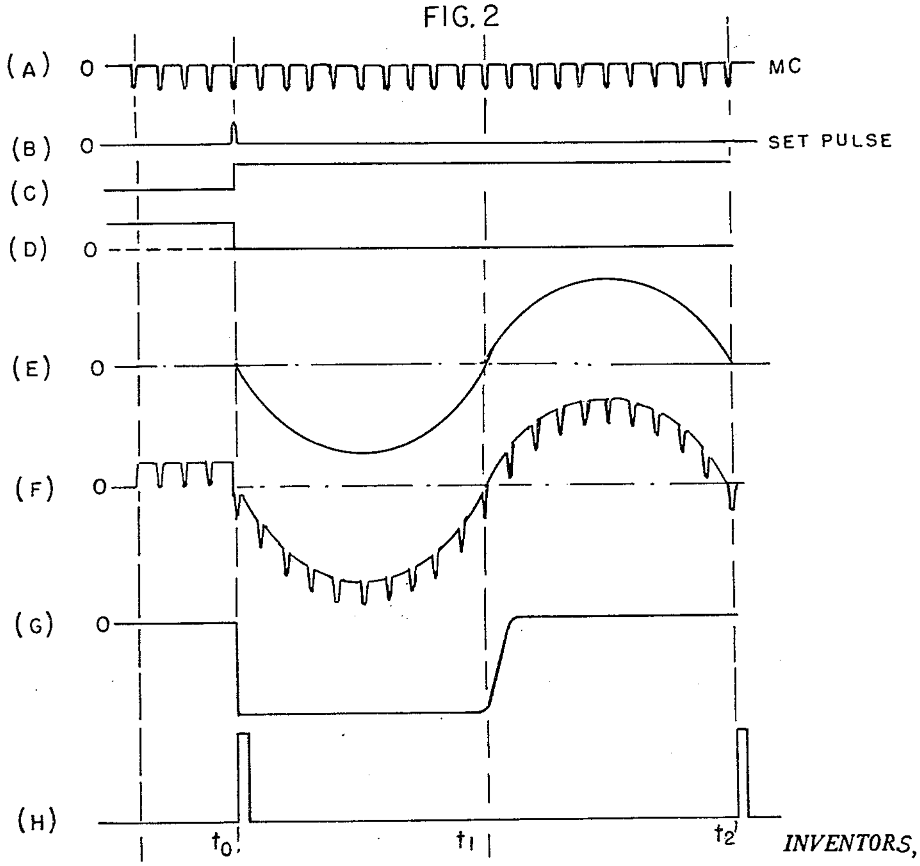
FIGS. 2A to 2H are graphical illustrations representing the waveforms produced at various points in the circuit of FIG. 1.

The operation of the divider circuit will be apparent from a consideration of the circuit of FIG. 1 in connection with the wave forms of FIG. 2, wherein the zero axes are as indicated and the interval $t_0$ to $t_2$ represents one cycle.

Master clock 38 supplies negative pulses as shown in FIG. 2A at regular intervals through coupling capacitor 49 to tank circuit 42. When the reset pulse is applied to terminal 58 of multivibrator 54, the output of the multivibrator shown in FIG. 2C assumes the lower voltage level and causes amplifier 60 to conduct. Current is fed from amplifier 60 through point B and coil 50 to resistance 52 such that point A as shown in FIG. 2D becomes positive with respect to ground. The positive potential at point A will bias diode 46 such as to prevent the pulses from clock 38 to reach transistor 10. As soon as the set pulse as shown in FIG. 2B which coincides with one of the pulses from clock 38 is applied to terminal 56 of the multivibrator 54, the output goes to the upper voltage level and remains there, this cuts off the current flowing from amplifier 60, whereby point A will return to ground potential. However, the interruption of the current flow from amplifier 60, which also passed through coil 50, causes tank circuit 42 to oscillate. The pulse from clock 38, which coincides with the set pulse, will now pass through diode 46 and reach point C, thus causing transistor 10 to conduct.

As shown in FIG. 2E, tank circuit 42 starts oscillating at zero phase of a negative sine wave and at full amplitude. At this time the voltage wave form at point B as shown in FIG. 2F is the linear superposition of the master clock 38, the voltage across resistor 52 at point A, and tank circuit 42. The trigger level of the blocking oscillator which includes transistor 10, windings 20 and 24, and diodes 46, 30 and 32, and resistor 34 is determined by the opening voltage of the input diode 46, which may be in the vicinity of .1 to .5 volt negative with respect to emitter 12. When transistor 10 is in its quiescent condition, emitter 12 is at ground potential. Hence, when tank circuit 42 voltage (point B) becomes negative with respect to ground, diode 46 starts conducting, driving base 16 negative with respect to emitter 12, which triggers transistor 10 into conduction.

At time $t_0$ transistor 10 is triggered and emitter current will flow through resistance 28 causing its upper end, point D, to become negative with respect to ground. Since diode 30 is poled for conduction towards point D, base 16 (point C) can never become more positive than the potential on point D, which includes the voltage induced in secondary winding 24. The duration of the negative potential at point C, caused by the potential at point D as shown in FIG. 2G, is set such that it is greater than ½ of the period of the sine wave ($t_0$ to $t_2$) produced by the tank circuit 42 voltage, but is smaller than the full period. The voltage drop produced across resistance 28 and observed at point D, is set to be higher than the amplitude of the sine wave across tank circuit 42 so that transistor 10 presents a load to the tank circuit only during the very short time interval when diode 46 is conducting. The conduction time of diode 46 is set for a smaller duration than the width of one clock pulse since diode 46 does not conduct when base 16 goes negative, and hence, only a small amount of energy is drawn off from tank circuit 42, which is desirable, to avoid frequency and phase changes of the tank circuit. In other words, the pulse frequency at emitter 12 is controlled almost exclusively by the frequency of the tank circuit, because once the transistor 10 conducts it is virtually decoupled from the tank circuit and hence doesn't load it. It is to be understood, of course, that the resistor 44 connected across diode 46 has a very high value to properly maintain the decoupled relationship. The conduction period of transistor 10 is determined by the mutual inductance between windings 20 and 24, and the characteristics of transistor 10. During the same interval, when transistor 10 is triggered by a negative pulse applied to base 16, the collector current increases until transistor 10 saturates, and current flows through primary winding 20 from collector 14 to the negative source 18 and causes the dotted end of winding 20 to go positive with respect to the other end. The voltage which appears across winding 20 is coupled to secondary and tertiary windings 24 and 26. When the field in transformer 22 collapses the collector current induces a positive voltage in winding 24 causing diode 30 to cut off the base 16 current supply to transistor 10. This instant, as indicated at $t_1$ in FIG. 2G, marks the end of conduction period of transistor 10. The remaining energy which was stored in transformer 22 will then be dissipated in resistor 34. The induced voltage in winding 26 provides a voltage whose leading edge is differentiated by pulse shaping circuit 62 to provide a sharp output pulse corresponding to the preselected clock pulse. The output wave form is shown in FIG. 2H.

The wave form at point D has, as can be seen in FIG. 2G, a very strong frequency component which has the same period and phase as the oscillation of the tank circuit 42. Part of this frequency component is fed to tank circuit 42, while transistor 10 is conducting, via winding 24, diode 30 and bridging resistor 44. The value of resistor 44 is chosen such that oscillations in tank circuit 42 will just be maintained by the energy fed through resistor 44. When the sine wave across the tank circuit (FIG. 2F) approaches zero voltage ($t_2$) from a positive direction, the *n*th pulse will again trigger transistor 10, and the foregoing cycle of operation is repeated.

The energy fed back from point D to the tank circuit 42 assures that the phase of the tank circuit relative to the master clock 38 is not drifting. Thus the tank circuit allows any *n*th pulse from the master clock 38 to reach transistor 10 and thus provide a constant division ratio. The stability required for the tank circuit 42 depends on the desired division ratio $$\frac{1}{n}$$

The natural frequency of the tank circuit 42 is selected to be $$\frac{1}{n}$$

where *n* is greater than 1 and *n* is the *n*th clock pulse desired. Hence, the frequency of tank circuit 42 is $$\frac{1}{n}$$

as shown in FIG. 2E. This is illustrated in FIG. 2, where an output pulse 2H is provided for every 20 input pulses as shown in FIG. 2A. By such an arrangement it is assured that only the preselected *n*th pulse can reach transistor 10 and trigger the blocking oscillator.

While there has been described what is at present considered to be the preferred embodiment of the invention, it will be obvious to those skilled in the art that various changes and modifications may be made therein without departing from the invention, and it is therefore aimed in the appended claims to cover all such changes and modifications as fall within the true spirit and scope of the invention.

What is claimed is:

1. A frequency divider circuit comprising a blocking oscillator having an input circuit and an output circuit, a tank circuit having a preselected natural frequency and stability, means for shock exciting said tank circuit into oscillation whereby there is produced an oscillation signal at a preselected phase and amplitude, a source of clock pulses having its recurring output coupled through said tank circuit whereby said clock pulses are combined with said oscillation signal, a gating means responsive to said combined signals and having its output coupled to the input of said blocking oscillator whereby every *n*th clock pulse triggers said blocking oscillator, the natural frequency of said tank circuit being $$\frac{1}{n}$$

where *n* is greater than 1 and *n* is the *n*th clock pulse desired, means responsive to the output of said blocking oscillator for feeding back energy through said gating means to maintain oscillation in said tank circuit, and utilization means connected to the output of said blocking oscillator.

2. A circuit in accordance with claim 1, in which said gating means comprises a parallel arrangement of a resistor and a diode, said diode being poled for conduction from said oscillator to said tank circuit.

3. A circuit in accordance with claim 1, in which said blocking oscillator comprises a transistor having an emitter, a collector and a base, a transformer having a primary and secondary winding, said primary winding connected to said collector, and said secondary winding being in circuit with said emitter and base, a supply voltage applied to said collector through said primary winding, the other terminal of said supply being ground, said feedback means comprising a resistor connected between emitter and ground, and a diode connected between said base and said secondary winding and poled for conduction towards the latter.

References Cited in the file of this patent

UNITED STATES PATENTS 2,591,660 Lindley et al. ----------- Apr. 1, 1952